(12) United States Patent
Walsh et al.

(10) Patent No.: US 10,282,496 B2
(45) Date of Patent: May 7, 2019

(54) GRAPH PARTITIONING TO DISTRIBUTE WELLS IN PARALLEL RESERVOIR SIMULATION

(71) Applicant: Schlumberger Technology Corporation, Sugar Land, TX (US)

(72) Inventors: Dominic Walsh, Houston, TX (US); Paul Woodhams, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 248 days.

(21) Appl. No.: 15/104,630

(22) PCT Filed: Jan. 2, 2015

(86) PCT No.: PCT/US2015/010065
§ 371 (c)(1),
(2) Date: Jun. 15, 2016

(87) PCT Pub. No.: WO2015/103494
PCT Pub. Date: Jul. 9, 2015

(65) Prior Publication Data
US 2017/0032064 A1    Feb. 2, 2017

Related U.S. Application Data

(60) Provisional application No. 61/923,505, filed on Jan. 3, 2014.

(51) Int. Cl.
*G06G 7/48* (2006.01)
*G06F 17/50* (2006.01)
(Continued)

(52) U.S. Cl.
CPC ...... *G06F 17/5009* (2013.01); *E21B 41/0092* (2013.01); *E21B 43/121* (2013.01);
(Continued)

(58) Field of Classification Search
None
See application file for complete search history.

(56) References Cited

U.S. PATENT DOCUMENTS

2007/0010979 A1    1/2007  Wallis et al.
2009/0306947 A1   12/2009  Davidson
(Continued)

FOREIGN PATENT DOCUMENTS

WO    2012158218        11/2012
WO    2013180709 A1    12/2013

OTHER PUBLICATIONS

Holmes, J.A. et al., "A Unified Wellbore Model for Reservoir Simulation", Sep. 19-22, 2010, SPE Annual Technical Conference and Exhibition, Society of Petroleum Engineers. (Year: 2010).*
(Continued)

*Primary Examiner* — Cedric Johnson
(74) *Attorney, Agent, or Firm* — Jaime A. Castano

(57) ABSTRACT

A method, apparatus, and program product use graph partitioning to distribute wells to a plurality of solve processors in a parallel reservoir simulation environment to optimize performance of well solve operations during reservoir simulations. Wells may be distributed to assign wells to partitions and associated solve processors and/or other processing resources in a manner that optimizes communication costs and/or costs associated with performing well solve operations.

14 Claims, 7 Drawing Sheets

(51) Int. Cl.

| | |
|---|---|
| *E21B 47/00* | (2012.01) |
| *G06F 9/50* | (2006.01) |
| *E21B 41/00* | (2006.01) |
| *E21B 43/12* | (2006.01) |
| *E21B 43/16* | (2006.01) |
| *E21B 43/25* | (2006.01) |

(52) U.S. Cl.
CPC .............. *E21B 43/16* (2013.01); *E21B 43/25* (2013.01); *E21B 47/00* (2013.01); *G06F 9/5061* (2013.01)

(56) References Cited

U.S. PATENT DOCUMENTS

| | | | |
|---|---|---|---|
| 2010/0217574 A1* | 8/2010 | Usadi | E21B 43/12 |
| | | | 703/10 |
| 2011/0191080 A1 | 8/2011 | Klie | |
| 2012/0296619 A1* | 11/2012 | Maliassov | E21B 43/00 |
| | | | 703/10 |
| 2014/0236558 A1* | 8/2014 | Maliassov | G01V 99/00 |
| | | | 703/10 |

OTHER PUBLICATIONS

Shuttleworth, Robert et al., "Partitioners for Parallelizing Reservoir Simulations", Feb. 2-4, 2009, SPE Reservoir Simulation Symposium, Society of Petroleum Engineers. (Year: 2009).*
PCT/US2015/010065, International Search Report and Written Opinion, dated Apr. 28, 2015, 9 pgs.

* cited by examiner

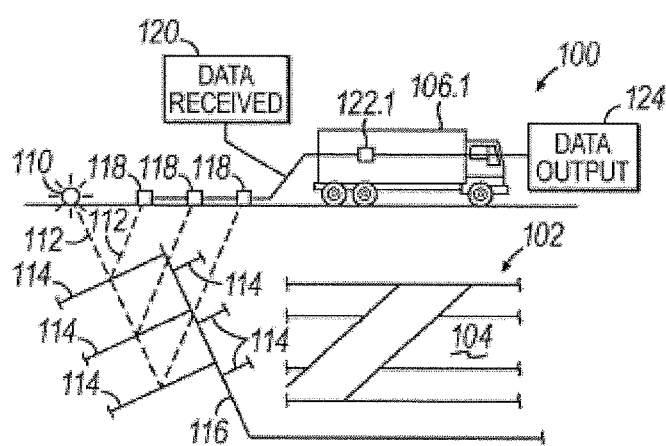
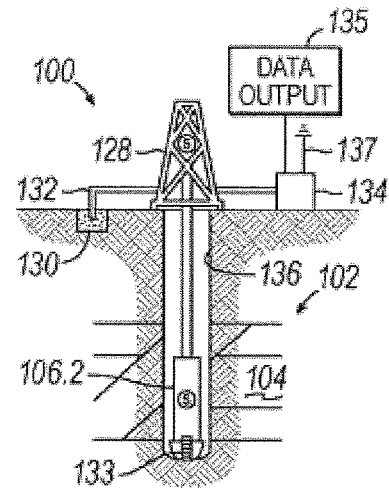
FIG. 2A  FIG. 2B
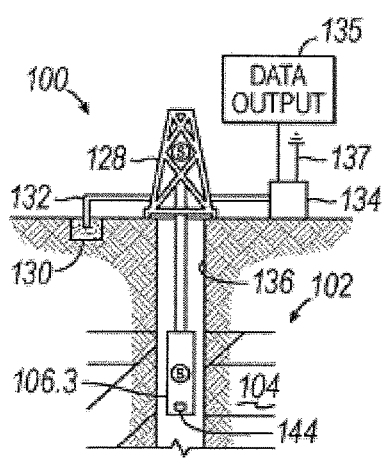
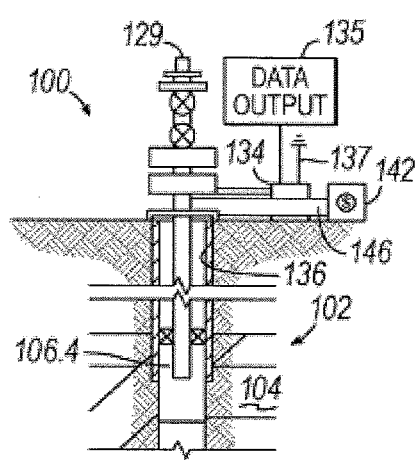
FIG. 2C  FIG. 2D

GRAPH PARTITIONING TO DISTRIBUTE WELLS IN PARALLEL RESERVOIR SIMULATION

CROSS-REFERENCE TO RELATED APPLICATION

This application claims the benefit of U.S. Provisional Application No. 61/923,505 filed on Jan. 3, 2014 by Paul Woodhams and Dominic Walsh, the entire disclosure of which is incorporated by reference herein in its entirety.

BACKGROUND

Techniques to aid recovery of material from a reservoir include model-based simulation techniques. Reservoir simulators, in particular, have been developed to examine the flow of fluid such as oil and gas within a reservoir and from the reservoir. Reservoir simulators are generally built on reservoir models that include the petrophysical characteristics needed to understand the behavior of the fluids over time, and may be used to predict future reservoir production under a series of potential scenarios, such as drilling new wells, injecting various fluids or stimulation. Reservoir simulations may be used, for example, to identify optimal numbers and/or locations of wells, optimal completions of wells, efficacy of artificial lift and/or enhanced oil recovery, and/or expected production of recoverable fluids.

Reservoir simulations generally take into account existing wells, as the wells drilled into the same reservoir, and particularly in the same regions of a reservoir, generally have an interrelated effect on their respective fluid flows, pressures, etc. experienced by other wells.

As computing power has increased, so too has the sophistication and modeling capabilities of a reservoir simulator. Reservoirs are generally modeled as three-dimensional collections of cells, with each cell modeling one or more properties of a particular volume of the reservoir. Over time, a need has continued to exist for modeling a reservoir with increasingly finer resolution, as doing so generally leads to more accurate simulation results. As a result, cell sizes continue to decrease, leading to an increased number of cells in a reservoir model. Moreover, reservoir simulators are increasingly relied upon to model larger and larger reservoirs, further increasing the number of cells in a reservoir model.

As the number of cells in a reservoir increases, however, the amount of computational resources needed to perform reservoir simulations has also increased. Given that similar computations may need to be performed for individual cells in a reservoir model during a reservoir simulation, parallel processing techniques may be used to perform these computations in parallel for different cells, thus decreasing the overall time needed to perform the simulations. High Performance Computing (HPC) computer systems, including supercomputers and other massively parallel computing systems, for example, are capable of devoting hundreds or thousands of individual processing resources to a complex reservoir simulation. Even for smaller and/or single-user computers such as workstations or desktop computers, however, multi-processor and/or multi-core processor architectures still provide ample opportunities for increased parallelism.

The performance of parallel reservoir simulations, however, can vary greatly based upon workload distribution among the processing resources performing the simulation. If some resources are overloaded with work, while other resources are sitting idle, the benefits of parallelism decrease. Moreover, the communication costs associated with communicating data between processing resources can decrease simulation performance, so whenever processing resources are needed to pass work or data between one another, performance is also adversely impacted.

For example, one aspect of many reservoir simulations involves the determination of a well index, or well transmissibility, for existing and/or potential wells coupled to a reservoir. To perform these "well solves", wells are generally assigned to processing resources based on a round-robin distribution or based on heuristic techniques. However, it has been found that a poor distribution of well solves between processing resources may lead to load imbalance, high communication costs and overall poor simulation performance.

A need therefore exists in the art for an improved manner of allocating well solves between available processing resources in a reservoir simulation.

SUMMARY

Wells may be partitioned in a parallel reservoir simulation environment by generating a graph including a plurality of well nodes and a plurality of processor nodes interconnected by a plurality of edges, where each well node is representative of a well, and where each processor node is representative of a processing resource among a plurality of processing resources in the parallel reservoir simulation environment; and partitioning the wells among the plurality of processing resources by performing a graph partition operation on the graph.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described example embodiments of the invention. This summary is merely provided to introduce a selection of concepts that are further described below in the detailed description, and is not intended to identify key or essential features of the claimed subject matter, nor is it intended to be used as an aid in limiting the scope of the claimed subject matter.

BRIEF DESCRIPTION OF THE DRAWINGS

FIGS. 2A-2D illustrate simplified, schematic views of an oilfield having subterranean formations containing reservoirs therein in accordance with implementations of various technologies and techniques described herein.

DETAILED DESCRIPTION

Figure 1:
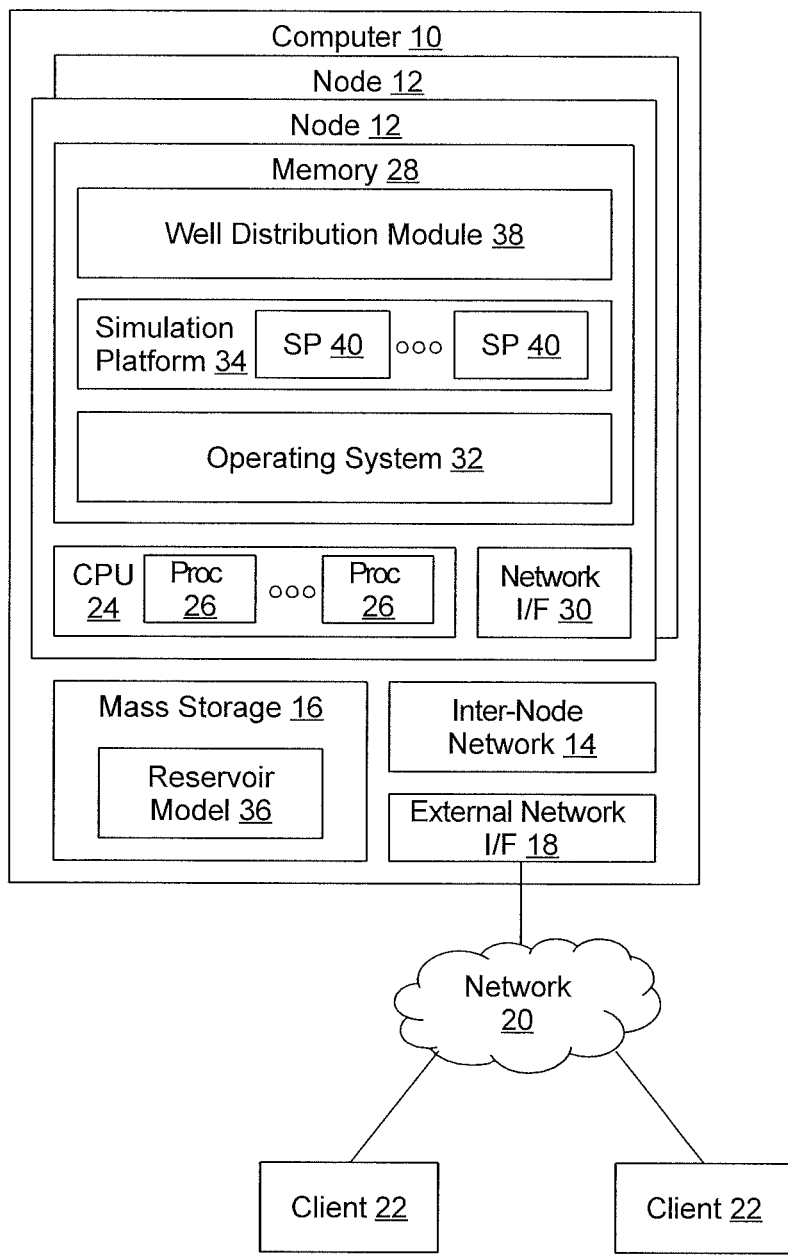
FIG. 1 is a block diagram of an example hardware and software environment for a data processing system in accordance with implementation of various technologies and techniques described herein.

The herein-described embodiments provide a method, apparatus, and program product that use graph partitioning to distribute wells to a plurality of solve processors in a parallel reservoir simulation environment to optimize performance of well solve operations during reservoir simulations. A graph may be created including well nodes associated with wells and processor nodes associated with solve processors and associated processing resources. Edges between the well nodes and the processor nodes are created to represent connections between wells and any reservoir cells owned by processor nodes. Well nodes, processor nodes and edges are weighted based on communication costs and/or costs of performing well solve operations. With the graph constructed in this way the partitioning will allocate wells to solve processes balancing computation versus communication resulting in optimized performance during reservoir simulations.

In some embodiments, wells are partitioned in a parallel reservoir simulation environment by, in a computer, generating a graph including a plurality of well nodes and a plurality of processor nodes interconnected by a plurality of edges, where each well node is representative of a well, and where each processor node is representative of a processing resource among a plurality of processing resources in the parallel reservoir simulation environment; and partitioning the wells among the plurality of processing resources by performing a graph partition operation on the graph.

Some embodiments also include weighting at least one of the well nodes, the processor nodes or the edges. Some embodiments further include weighting each well node based upon a cost of solving the represented well. Some embodiments also include dynamically determining the cost of solving the represented well, some embodiments may further include determining the cost of solving the represented well by accessing a cost model, and some embodiments may also include weighting each processor node based upon a sum of a weight of each well node.

Some embodiments may further include forming a connection edge between a first well node and a first processor node if the first processor node owns any reservoir cells connected to the well represented by the first well node. Some embodiments may also include weighting the connection edge based on a number of owned cells in a reservoir model connected to the well represented by the first well node, and some embodiments may also include forming potential edges between each pair of well nodes and processor nodes not having a connection edge. In some embodiments, the potential edges are weighted lower than any connection edge.

In addition, some embodiments also include performing a plurality of parallel well solves after partitioning the wells, while some embodiments also include running a reservoir flow simulation after performing the plurality of parallel well solves. Some embodiments further include dynamically repartitioning the wells while performing the plurality of parallel well solves.

Some embodiments may include an apparatus including at least one processor and program code configured upon execution by the at least one processor to partition wells in a parallel reservoir simulation environment in any of the manners discussed herein. Some embodiments may include a program product including a computer readable medium and program code stored on the computer readable medium and configured upon execution by at least one processor to partition wells in a parallel reservoir simulation environment in any of the manners discussed herein.

Other variations and modifications will be apparent to one of ordinary skill in the art.

Hardware and Software Environment

Turning now to the drawings, wherein like numbers denote like parts throughout the several views, FIG. 1 illustrates an example data processing system 10 suitable for providing a parallel reservoir simulation environment in which well distribution for a reservoir simulation may be implemented. System 10 is illustrated as a computer including a plurality of computing nodes 12 coupled to one another by an inter-node network 14, and including additional hardware resources, e.g., mass storage 16 and an external network interface 18, the latter of which may be coupled to a network 20 for communication with one or more client computers 22.

Each node 12 may include a central processing unit 24 including a plurality of hardware-based processors 26 coupled to a memory 28, which may represent the random access memory (RAM) devices comprising the main storage of computer 10, as well as any supplemental levels of memory, e.g., cache memories, non-volatile or backup memories (e.g., programmable or flash memories), read-only memories, etc. In addition, memory 28 may be considered to include memory storage physically located elsewhere in computer 10, e.g., any cache memory in a processor, as well as any storage capacity used as a virtual memory, e.g., as stored on a mass storage device 16 or on another computer coupled to computer 10. Each processor 26 may include one or more processing cores, and each processing core may be multi-threaded or single-threaded.

In the embodiment illustrated in FIG. 1, computer 10 is a High Performance Computing (HPC) computer, and as such, may include tens, hundreds or even thousands of nodes 12, each with multiple processors 26. Furthermore, nodes 12 may be organized in various manners, e.g., based on physical location or communication costs therebetween, as may the processors within each node. In addition, it will be appreciated that multiple computers may be networked together in a clustered arrangement. It will also be appreciated that the invention may be implemented in other embodiments using other types of computers, including servers, laptop computers, desktop computers, workstations, and other single-user or multi-user electronic devices having processing resources that are capable of being allocated for parallel execution. Therefore, the invention is not limited to the particular architecture illustrated in FIG. 1.

Moreover, it will be appreciated that regardless of how processor chips are distributed within a computer, e.g., within multi-chip modules, within cabinets, drawers, slots, racks, cards, etc., and as well as how many individual cores, hardware threads, etc. are present within any processor, the available processing capability of a computer may be considered to include a plurality of "processing resources" of various types of granularity. In addition, where software virtualization is used, and multiple software threads, tasks, processes, virtual machines, etc., are permitted to execute on the same processing logic, processing resources may be considered to include even fractions of a processor or processing core. Embodiments consistent with the invention may be used, for example, to distribute wells among a plurality of processing resources, and the processing resources may represent as little as a time-slices from a hardware thread, to dedicated hardware threads in a processing core, dedicated processing cores in a processor chip, dedicated processor chips in a node, nodes in a computer, or computers in a cluster, or even multiple instances thereof. Therefore, the invention may be used in practically any environment where processing resources may be split up and allocated to handle multiple operations in parallel.

Computer 10 generally operates under the control of an operating system 32 (which may be instantiated and/or distributed among multiple nodes) and executes or otherwise relies upon various computer software applications, components, programs, objects, modules, data structures, etc. For example, to implement well distribution for a reservoir simulation, a simulation platform 34 may be used to generate a reservoir model 36 (shown resident in mass storage 16), and a well distribution module 38 may be executed within the simulation platform to perform well distribution in the manner described herein.

In addition, as will be discussed in greater detail below, simulation platform 34 may support a plurality of "solve processors" SP 40 configured to concurrently execute on a plurality of processing resources to perform operations associated with a parallel reservoir simulation. In different embodiments of the invention, the solve processors may be considered to be software entities (e.g., threads or virtual processors) mapped to hardware processing resources, or may be considered to be hardware processing resources without abstracting software entities.

In general, the routines executed to implement the embodiments disclosed herein, whether implemented as part of an operating system or a specific application, component, program, object, module or sequence of instructions, or even a subset thereof, will be referred to herein as "computer program code," or simply "program code." Program code generally comprises one or more instructions that are resident at various times in various memory and storage devices in a computer, and that, when read and executed by one or more processors in a computer, cause that computer to perform the steps embodying desired functionality. Moreover, while embodiments have and hereinafter will be described in the context of fully functioning computers and computer systems, those skilled in the art will appreciate that the various embodiments are capable of being distributed as a program product in a variety of forms, and that the invention applies equally regardless of the particular type of computer readable media used to actually carry out the distribution.

Such computer readable media may include computer readable storage media and communication media. Computer readable storage media is non-transitory in nature, and may include volatile and non-volatile, and removable and non-removable media implemented in any method or technology for storage of information, such as computer-readable instructions, data structures, program modules or other data. Computer readable storage media may further include RAM, ROM, erasable programmable read-only memory (EPROM), electrically erasable programmable read-only memory (EEPROM), flash memory or other solid state memory technology, CD-ROM, DVD, or other optical storage, magnetic cassettes, magnetic tape, magnetic disk storage or other magnetic storage devices, or any other medium that can be used to store the desired information and which can be accessed by computer 10. Communication media may embody computer readable instructions, data structures or other program modules. By way of example, and not limitation, communication media may include wired media such as a wired network or direct-wired connection, and wireless media such as acoustic, RF, infrared and other wireless media. Combinations of any of the above may also be included within the scope of computer readable media.

Program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the endless number of manners in which computer programs may be organized into routines, procedures, methods, modules, objects, and the like, as well as the various manners in which program functionality may be allocated among various software layers that are resident within a computer (e.g., operating systems, libraries, API's, applications, applets, etc.), the invention is not limited to the specific organization and allocation of program functionality described herein.

Those skilled in the art will recognize that the example environment illustrated in FIG. 1 is not intended to limit the invention. Indeed, those skilled in the art will recognize that other alternative hardware and/or software environments may be used without departing from the scope of the invention.

Oilfield Operations

FIGS. 2a-2d illustrate simplified, schematic views of an oilfield 100 having subterranean formation 102 containing reservoir 104 therein in accordance with implementations of various technologies and techniques described herein. FIG. 2a illustrates a survey operation being performed by a survey tool, such as seismic truck 106.1, to measure properties of the subterranean formation. The survey operation is a seismic survey operation for producing sound vibrations. In FIG. 2a, one such sound vibration, sound vibration 112 generated by source 110, reflects off horizons 114 in earth formation 116. A set of sound vibrations is received by sensors, e.g., geophone-receivers 118, situated on the earth's surface. The data received 120 is provided as input data to a computer 122.1 of a seismic truck 106.1, and responsive to the input data, computer 122.1 generates seismic data output 124. This seismic data output may be stored, transmitted or further processed as desired, e.g., by data reduction.

FIG. 2b illustrates a drilling operation being performed by drilling tools 106.2 suspended by rig 128 and advanced into subterranean formations 102 to form wellbore 136. Mud pit 130 is used to draw drilling mud into the drilling tools via flow line 132 for circulating drilling mud down through the drilling tools, then up wellbore 136 and back to the surface. The drilling mud may be filtered and returned to the mud pit. A circulating system may be used for storing, controlling, or filtering the flowing drilling muds. The drilling tools are advanced into subterranean formations 102 to reach reservoir 104. Each well may target one or more reservoirs. The drilling tools are adapted for measuring downhole properties using logging while drilling tools. The logging while drilling tools may also be adapted for taking core sample 133 as shown.

Computer facilities may be positioned at various locations about the oilfield 100 (e.g., the surface unit 134) and/or at remote locations. Surface unit 134 may be used to communicate with the drilling tools and/or offsite operations, as well as with other surface or downhole sensors. Surface unit 134 is capable of communicating with the drilling tools to send commands to the drilling tools, and to receive data therefrom. Surface unit 134 may also collect data generated during the drilling operation and produces data output 135, which may then be stored or transmitted.

Sensors (S), such as gauges, may be positioned about oilfield 100 to collect data relating to various oilfield operations as described previously. As shown, sensor (S) is positioned in one or more locations in the drilling tools and/or at rig 128 to measure drilling parameters, such as weight on bit, torque on bit, pressures, temperatures, flow rates, compositions, rotary speed, and/or other parameters of the field operation. Sensors (S) may also be positioned in one or more locations in the circulating system.

Drilling tools 106.2 may include a bottom hole assembly (BHA) (not shown), generally referenced, near the drill bit (e.g., within several drill collar lengths from the drill bit). The bottom hole assembly includes capabilities for measuring, processing, and storing information, as well as communicating with surface unit 134. The bottom hole assembly further includes drill collars for performing various other measurement functions.

The bottom hole assembly may include a communication subassembly that communicates with surface unit 134. The communication subassembly is adapted to send signals to and receive signals from the surface using a communications channel such as mud pulse telemetry, electro-magnetic telemetry, or wired drill pipe communications. The communication subassembly may include, for example, a transmitter that generates a signal, such as an acoustic or electromagnetic signal, which is representative of the measured drilling parameters. It will be appreciated by one of skill in the art that a variety of telemetry systems may be employed, such as wired drill pipe, electromagnetic or other known telemetry systems.

Generally, the wellbore is drilled according to a drilling plan that is established prior to drilling. The drilling plan sets forth equipment, pressures, trajectories and/or other parameters that define the drilling process for the wellsite. The drilling operation may then be performed according to the drilling plan. However, as information is gathered, the drilling operation may need to deviate from the drilling plan. Additionally, as drilling or other operations are performed, the subsurface conditions may change. The earth model may also be adjusted as new information is collected.

The data gathered by sensors (S) may be collected by surface unit 134 and/or other data collection sources for analysis or other processing. The data collected by sensors (S) may be used alone or in combination with other data. The data may be collected in one or more databases and/or transmitted on or offsite. The data may be historical data, real time data, or combinations thereof. The real time data may be used in real time, or stored for later use. The data may also be combined with historical data or other inputs for further analysis. The data may be stored in separate databases, or combined into a single database.

Surface unit 134 may include transceiver 137 to allow communications between surface unit 134 and various portions of the oilfield 100 or other locations. Surface unit 134 may also be provided with or functionally connected to one or more controllers (not shown) for actuating mechanisms at oilfield 100. Surface unit 134 may then send command signals to oilfield 100 in response to data received. Surface unit 134 may receive commands via transceiver 137 or may itself execute commands to the controller. A processor may be provided to analyze the data (locally or remotely), make the decisions and/or actuate the controller. In this manner, oilfield 100 may be selectively adjusted based on the data collected. This technique may be used to optimize portions of the field operation, such as controlling drilling, weight on bit, pump rates, or other parameters. These adjustments may be made automatically based on computer protocol, and/or manually by an operator. In some cases, well plans may be adjusted to select optimum operating conditions, or to avoid problems.

FIG. 2c illustrates a wireline operation being performed by wireline tool 106.3 suspended by rig 128 and into wellbore 136 of FIG. 2b. Wireline tool 106.3 is adapted for deployment into wellbore 136 for generating well logs, performing downhole tests and/or collecting samples. Wireline tool 106.3 may be used to provide another method and apparatus for performing a seismic survey operation. Wireline tool 106.3 may, for example, have an explosive, radioactive, electrical, or acoustic energy source 144 that sends and/or receives electrical signals to surrounding subterranean formations 102 and fluids therein.

Wireline tool 106.3 may be operatively connected to, for example, geophones 118 and a computer 122.1 of a seismic truck 106.1 of FIG. 2a. Wireline tool 106.3 may also provide data to surface unit 134. Surface unit 134 may collect data generated during the wireline operation and may produce data output 135 that may be stored or transmitted. Wireline tool 106.3 may be positioned at various depths in the wellbore 136 to provide a survey or other information relating to the subterranean formation 102.

Sensors (S), such as gauges, may be positioned about oilfield 100 to collect data relating to various field operations as described previously. As shown, sensor S is positioned in wireline tool 106.3 to measure downhole parameters which relate to, for example porosity, permeability, fluid composition and/or other parameters of the field operation.

FIG. 2d illustrates a production operation being performed by production tool 106.4 deployed from a production unit or Christmas tree 129 and into completed wellbore 136 for drawing fluid from the downhole reservoirs into surface facilities 142. The fluid flows from reservoir 104 through perforations in the casing (not shown) and into production tool 106.4 in wellbore 136 and to surface facilities 142 via gathering network 146.

Sensors (S), such as gauges, may be positioned about oilfield 100 to collect data relating to various field operations as described previously. As shown, the sensor (S) may be positioned in production tool 106.4 or associated equipment, such as christmas tree 129, gathering network 146, surface facility 142, and/or the production facility, to measure fluid parameters, such as fluid composition, flow rates, pressures, temperatures, and/or other parameters of the production operation.

Production may also include injection wells for added recovery. One or more gathering facilities may be operatively connected to one or more of the wellsites for selectively collecting downhole fluids from the wellsite(s).

While FIGS. 2b-2d illustrate tools used to measure properties of an oilfield, it will be appreciated that the tools may be used in connection with non-oilfield operations, such as gas fields, mines, aquifers, storage, or other subterranean facilities. Also, while certain data acquisition tools are depicted, it will be appreciated that various measurement tools capable of sensing parameters, such as seismic two-way travel time, density, resistivity, production rate, etc., of the subterranean formation and/or its geological formations may be used. Various sensors (S) may be located at various positions along the wellbore and/or the monitoring tools to collect and/or monitor the desired data. Other sources of data may also be provided from offsite locations.

The field configurations of FIGS. 2a-2d are intended to provide a brief description of an example of a field usable with oilfield application frameworks. Part, or all, of oilfield 100 may be on land, water, and/or sea. Also, while a single field measured at a single location is depicted, oilfield applications may be utilized with any combination of one or more oilfields, one or more processing facilities and one or more wellsites.

Figure 3:
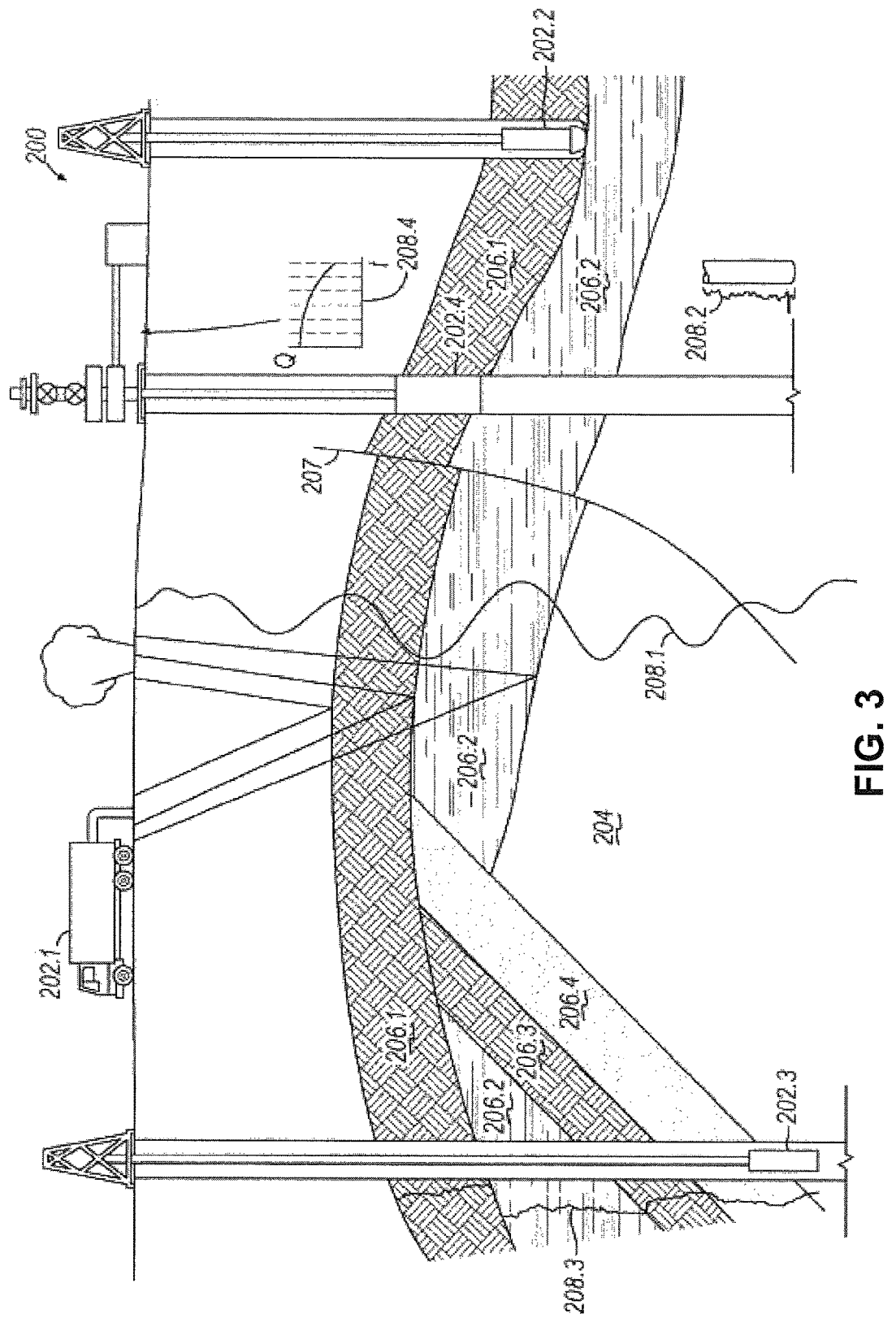
FIG. 3 illustrates a schematic view, partially in cross section of an oilfield having a plurality of data acquisition tools positioned at various locations along the oilfield for collecting data from the subterranean formations in accordance with implementations of various technologies and techniques described herein.

FIG. 3 illustrates a schematic view, partially in cross section of oilfield 200 having data acquisition tools 202.1, 202.2, 202.3 and 202.4 positioned at various locations along oilfield 200 for collecting data of subterranean formation 204 in accordance with implementations of various technologies and techniques described herein. Data acquisition tools 202.1-202.4 may be the same as data acquisition tools 106.1-106.4 of FIGS. 2a-2d, respectively, or others not depicted. As shown, data acquisition tools 202.1-202.4 generate data plots or measurements 208.1-208.4, respectively. These data plots are depicted along oilfield 200 to demonstrate the data generated by the various operations.

Data plots 208.1-208.3 are examples of static data plots that may be generated by data acquisition tools 202.1-202.3, respectively, however, it should be understood that data plots 208.1-208.3 may also be data plots that are updated in real time. These measurements may be analyzed to better define the properties of the formation(s) and/or determine the accuracy of the measurements and/or for checking for errors. The plots of each of the respective measurements may be aligned and scaled for comparison and verification of the properties.

Static data plot 208.1 is a seismic two-way response over a period of time. Static plot 208.2 is core sample data measured from a core sample of the formation 204. The core sample may be used to provide data, such as a graph of the density, porosity, permeability, or some other physical property of the core sample over the length of the core. Tests for density and viscosity may be performed on the fluids in the core at varying pressures and temperatures. Static data plot 208.3 is a logging trace that generally provides a resistivity or other measurement of the formation at various depths.

A production decline curve or graph 208.4 is a dynamic data plot of the fluid flow rate over time. The production decline curve generally provides the production rate as a function of time. As the fluid flows through the wellbore, measurements are taken of fluid properties, such as flow rates, pressures, composition, etc.

Other data may also be collected, e.g., historical data, user inputs, economic information, and/or other measurement data and parameters of interest. Static and dynamic measurements may be analyzed and used to generate models of the subterranean formation to determine characteristics thereof. Similar measurements may also be used to measure changes in formation aspects over time.

The subterranean structure 204 has a plurality of geological formations 206.1-206.4. As shown, this structure has several formations or layers, including a shale layer 206.1, a carbonate layer 206.2, a shale layer 206.3 and a sand layer 206.4. A fault 207 extends through the shale layer 206.1 and the carbonate layer 206.2. The static data acquisition tools are adapted to take measurements and detect characteristics of the formations.

While a specific subterranean formation with specific geological structures is depicted, it will be appreciated that oilfield 200 may contain a variety of geological structures and/or formations, sometimes having extreme complexity. In some locations, generally below the water line, fluid may occupy pore spaces of the formations. Each of the measurement devices may be used to measure properties of the formations and/or its geological features. While each acquisition tool is shown as being in specific locations in oilfield 200, it will be appreciated that one or more types of measurement may be taken at one or more locations across one or more fields or other locations for comparison and/or analysis.

The data collected from various sources, such as the data acquisition tools of FIG. 3, may then be processed and/or evaluated. Seismic data displayed in static data plot 208.1 from data acquisition tool 202.1 may be used by a geophysicist to determine characteristics of the subterranean formations and features. The core data shown in static plot 208.2 and/or log data from well log 208.3 are generally used by a geologist to determine various characteristics of the subterranean formation. The production data from graph 208.4 is generally used by the reservoir engineer to determine fluid flow reservoir characteristics. The data analyzed by the geologist, geophysicist and the reservoir engineer may be analyzed using modeling techniques.

Figure 4:
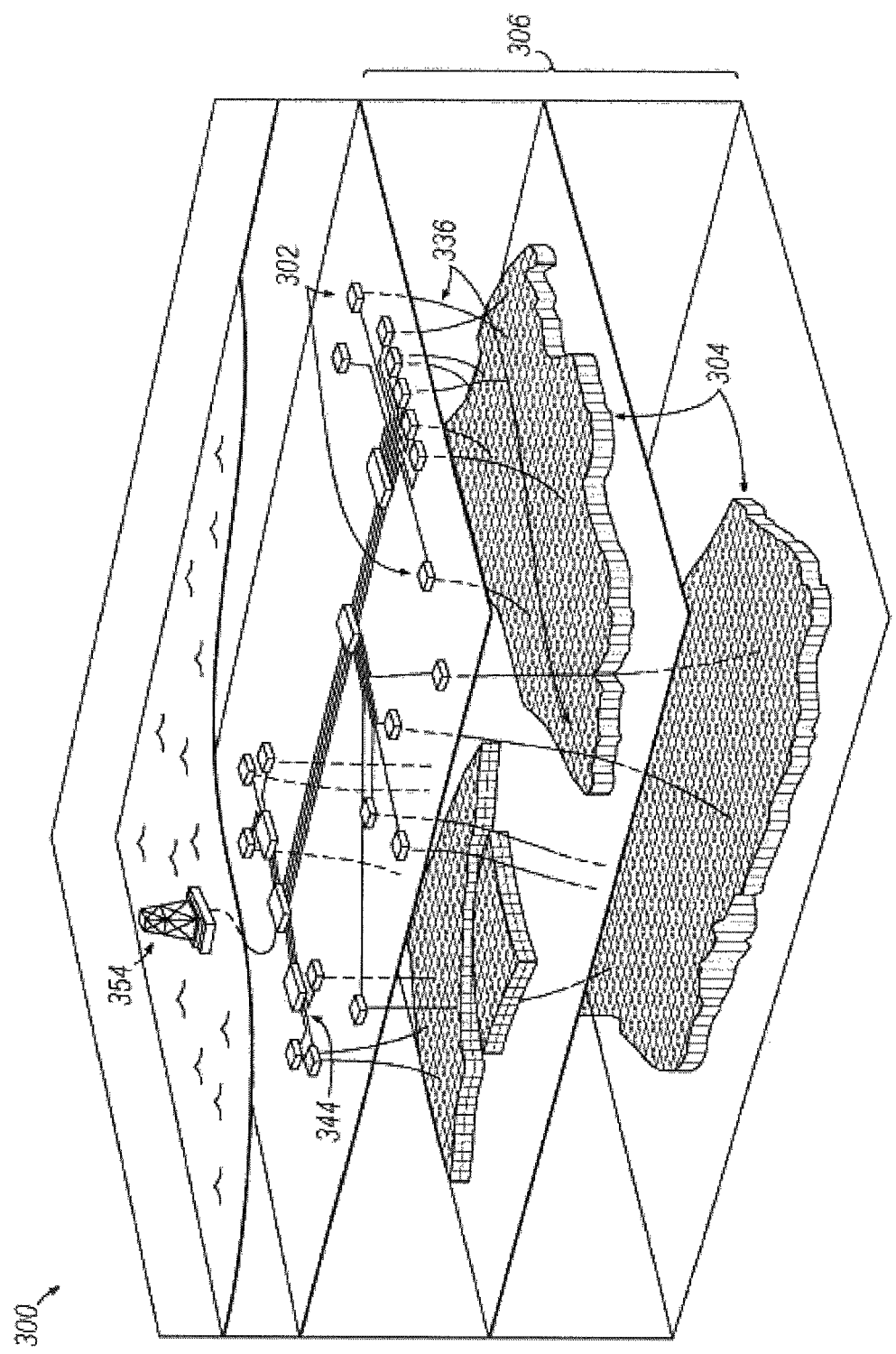
FIG. 4 illustrates a production system for performing one or more oilfield operations in accordance with implementations of various technologies and techniques described herein.

FIG. 4 illustrates an oilfield 300 for performing production operations in accordance with implementations of various technologies and techniques described herein. As shown, the oilfield has a plurality of wellsites 302 operatively connected to central processing facility 354. The oilfield configuration of FIG. 4 is not intended to limit the scope of the oilfield application system. Part or all of the oilfield may be on land and/or sea. Also, while a single oilfield with a single processing facility and a plurality of wellsites is depicted, any combination of one or more oilfields, one or more processing facilities and one or more wellsites may be present.

Each wellsite 302 has equipment that forms wellbore 336 into the earth. The wellbores extend through subterranean formations 306 including reservoirs 304. These reservoirs 304 contain fluids, such as hydrocarbons. The wellsites draw fluid from the reservoirs and pass them to the processing facilities via surface networks 344. The surface networks 344 have tubing and control mechanisms for controlling the flow of fluids from the wellsite to processing facility 354.

Well Distribution for a Reservoir Simulation

Embodiments consistent with the invention may be used to distribute wells to a plurality of "solve processors" resident in a computer and executing within a reservoir simulation environment. A solve processor, for example, may be considered to represent a processing resource or a set of processing resources, which may be abstracted by a software construct, and which generally is capable of operating in parallel with other solve processors to perform well solve operations for a reservoir simulator, e.g., to calculate well indexes for wells associated with a reservoir.

In this embodiment, a reservoir model is partitioned into a plurality of partitions, with each partition representing a sub-volume of the reservoir, and thus including those cells from the reservoir model that correspond to the associated sub-volume. A solve processor is allocated to each reservoir partition, and thus, each reservoir partition is associated with a set of processing resources.

Wells gather fluid from disparate regions of a reservoir. As such, wells may connect to regions of the reservoir assigned to differing partitions and processing resources. A well solve operation for a particular well consequently generally incorporates queries to multiple solve processors, and thus, communication costs are associated with queries to solve processors, generally with higher communication costs associated with queries to solve processors other than the solve processor to which a particular well is assigned. Thus, well distribution in some embodiments attempts to optimize performance based on equally distributing the work allocated to each solve processor, and minimizing communication costs between solve processors.

As noted above, a poor distribution of well solves between solve processors may lead to load imbalance, high communication costs and overall poor performance. Embodiments of the invention address this problem by utilizing graph partitioning, e.g., a METIS multi-level graph partitioning operation, or another graph partitioning operation such as a Zoltan graph partitioning operation from Sandia Lab, to optimally perform this task. Other graph partitioning algorithms, including various graph partitioning algorithms provided by any of the METIS/ParMETIS, SCOTCH/PT-SCOTCH or Zoltan partitioning libraries, among others may be used in other embodiments of the invention.

A graph partitioning operation consistent with the invention, for example, may include forming a graph representing both the wells and solve processors as nodes and weighting the nodes and edges appropriately such that the graph partitioning operation will give an optimally load balanced distribution of the wells between processors whilst minimizing the associated communication costs.

Figure 5:
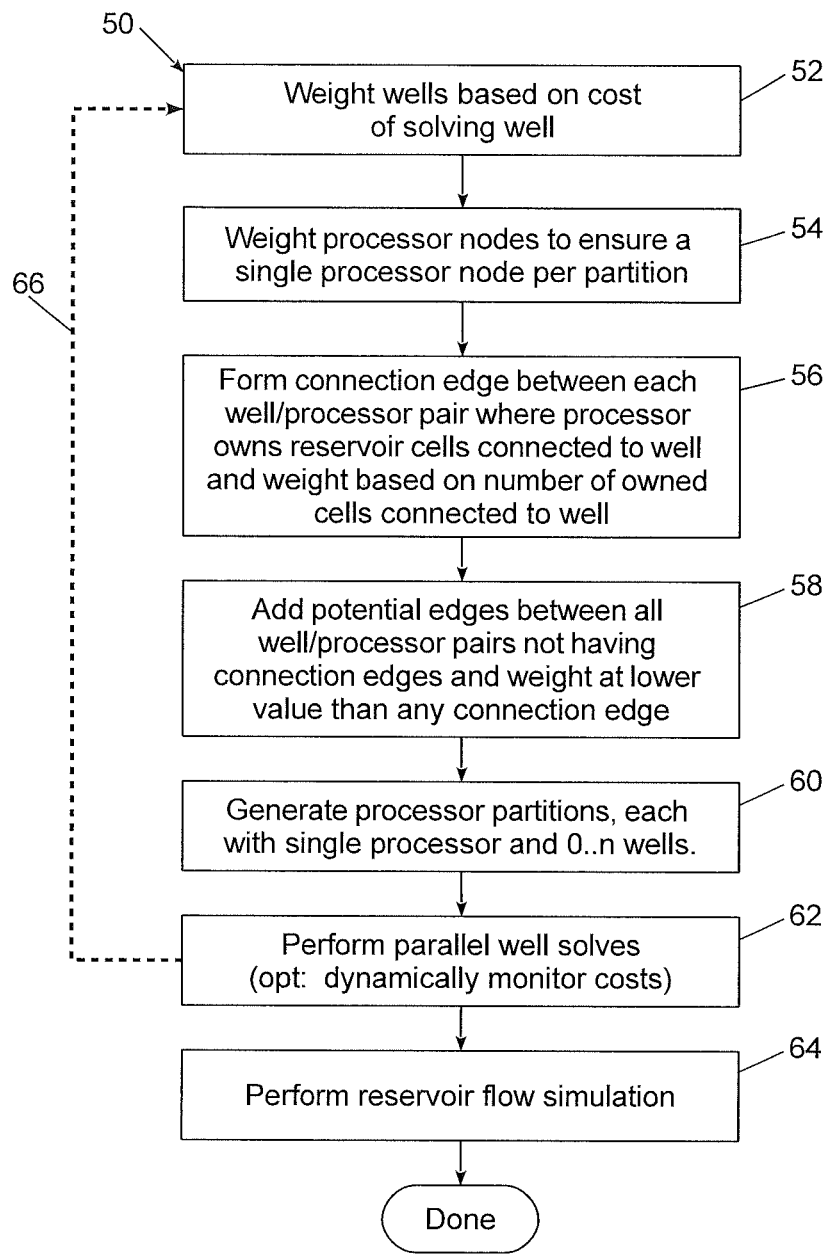
FIG. 5 is a flowchart illustrating a sequence of operations for distributing wells in a reservoir simulation in accordance with implementations of various technologies and techniques described herein.

FIG. 5 illustrates an example well distribution routine 50 capable of being performed by well distribution module 38 of FIG. 1. In block 52, for example, well nodes (W*) are weighted based on the cost of solving the well, e.g., based on computation costs, communication costs or a combination of computation and communication costs associated with solving the well. For example, in some embodiments, the costs of solving a particular well may be based in part on the number of completions associated with the well and the computation and/or communication costs associated with processing each completion. In addition, in some embodiments costs may also be based in part on any surface network coupled to a well. Furthermore, it will be appreciated that wells may be defined but lie dormant for an appreciable amount of time until they are turned on and a "solve" is necessary, and as such, for dynamic rebalancing the number of times a particular well is solved may also be estimated.

Next, in block 54, solve processor nodes (P*) are weighted as the sum of all the well weights (determined in block 52) connected to the solve processor nodes to ensure no two are assigned to the same graph partition. Those skilled in the art having the benefit of the instant disclosure will appreciate that there are various alternatives to ensure each graph partition includes only one solve processor node P*, e.g., using the processor nodes as seed/starting points for the partitioning algorithm, and that such alternatives will generally be specific to the partitioning algorithm used.

Next, in block 56, a connection edge is formed between each well/processor pair if the solve processor owns any reservoir cells connected to the well. The weight of the edge may be based, for example, on the number of owned cells connected to the well. As the weight may generally be used in some embodiments to reflect communication costs, different weight assignment algorithms may be used in different implementations, e.g., to reflect the impact of communication for matrix operations.

Next, as shown in block 58, to enable a well to be assigned to any solve processor, potential edges may be added between all solve processors and all wells that do not have a connection edge. These potential edges may be weighted such that potential edges are reduced in preference to connection edges. Thus an optimal load balance of the computation cost may be achieved while taking into account the increase in communication cost of assigning a well to an unconnected process.

Once the graph is formed a graph partition operation is performed in block 60 (e.g., by calling a partitioning library in the simulation platform, e.g., a METIS/ParMETIS, SCOTCH/PT-SCOTCH or Zoltan partitioning library) to produce nProcessors partitions, with each partition including a single solve processor, and 0-nWells wells. The wells in a partition are assigned to the solve processor in their partition, and the result is a distribution of well solves. The distribution in this embodiment may be based on both the cost of communication and the cost of the well solve operation, although other factors may come into play in other embodiments.

Once the distribution is complete, parallel well solves are performed by the solve processors in block 62 based upon the well distribution determined via the graph partition operation performed in block 60. In addition, as shown in block 64, the results of the well solves may subsequently used in reservoir flow simulation, e.g., for determining expected production, history matching (i.e., validating a simulation model against field data), prediction (i.e., optimizing recovery by investigating various development strategies, determining how big to build a processing facility or what particular characteristics it may have to deal with, such as high sulfur, determining the value of a reserve to predict what fraction of the in place hydrocarbons can be produced, etc. Upon completion of the reservoir simulation, routine 50 is complete. It will be appreciated that the well indexes determined via the well solves may also be used for other purposes, so block 64 is optional in some embodiments.

In some embodiments, therefore, a graph partition operation is performed prior to initiating any well solve operations. In other embodiments, however, graph partition operations may be performed during the performance of well solve operations to dynamically repartition wells among solve processors, as represented by dashed line 66 of FIG. 5. Moreover, as also shown in block 62 of FIG. 5, costs may be dynamically monitored while performing the well solves to track the actual performance of the solve processors. The monitored costs may then be used during a dynamic repartition operation to optimize the partitions based upon actual performance data. In still other embodiments, however, costs may not be monitored dynamically, and repartitioning may be performed to account for changes occurring in the course of a simulation (e.g., the addition or removal of cells), changes in costs of solves (e.g., if a well is approaching a numerical transition due to incident water or hitting the limit of a production constraint prior to being shut), well-related changes (e.g., wells being shut-in, new wells being opened or new completions being made for existing wells), etc.

It will be appreciated that the manner in which weights may be applied may be determined in a number of ways, e.g., heuristically, based on the particular processing resources and/or communication costs within a computer, based upon the overhead associated with performing well solve operations, etc. In some embodiments, for example, weights may be determined using a cost model derived through measurements of costs taken during or after performing well solve operations. In some embodiments, costs may be monitored dynamically during well solve operations, and in some embodiments, monitored costs may be used to trigger dynamic repartitioning whenever a sub-optimal partitioning is detected (e.g., based upon detection of one or more over-utilized solve processors and/or one or more under-utilized solve processors). In other embodiments, actual costs may be determined at the completion of a well solve operation for use in updating a cost model.

Figure 6:
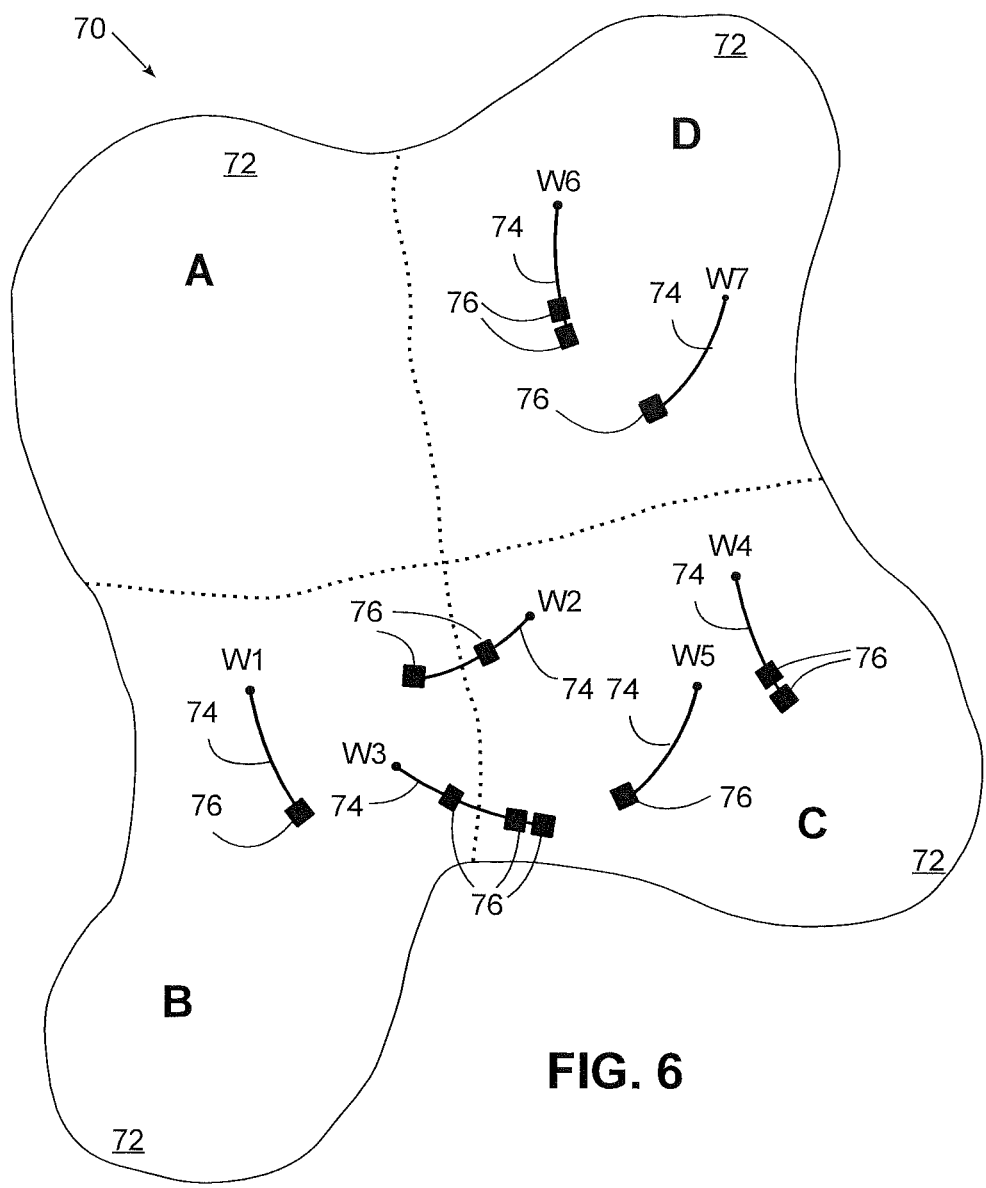
FIG. 6 illustrates an example reservoir model upon which a reservoir simulation may be performed in accordance with implementations of various technologies and techniques described herein.

As a further illustration of the operation of routine 50 of FIG. 5, FIG. 6 illustrates an example reservoir model 70 partitioned into four domains or partitions 72 (also denoted as partitions A, B, C and D), which are distinguished by the dashed lines in the figure, and which are assigned respectively to solve processors P1, P2, P3 and P4 (not shown in FIG. 6). Seven wells 74 (also designated as wells W1, W2, W3, W4, W5, W6 and W7) are also illustrated within the reservoir model, with each well 74 including one or more completions 76. It will be noted that wells W2 and W3 include multiple completions, and these completions are located in different partitions B and C.

Figure 7:
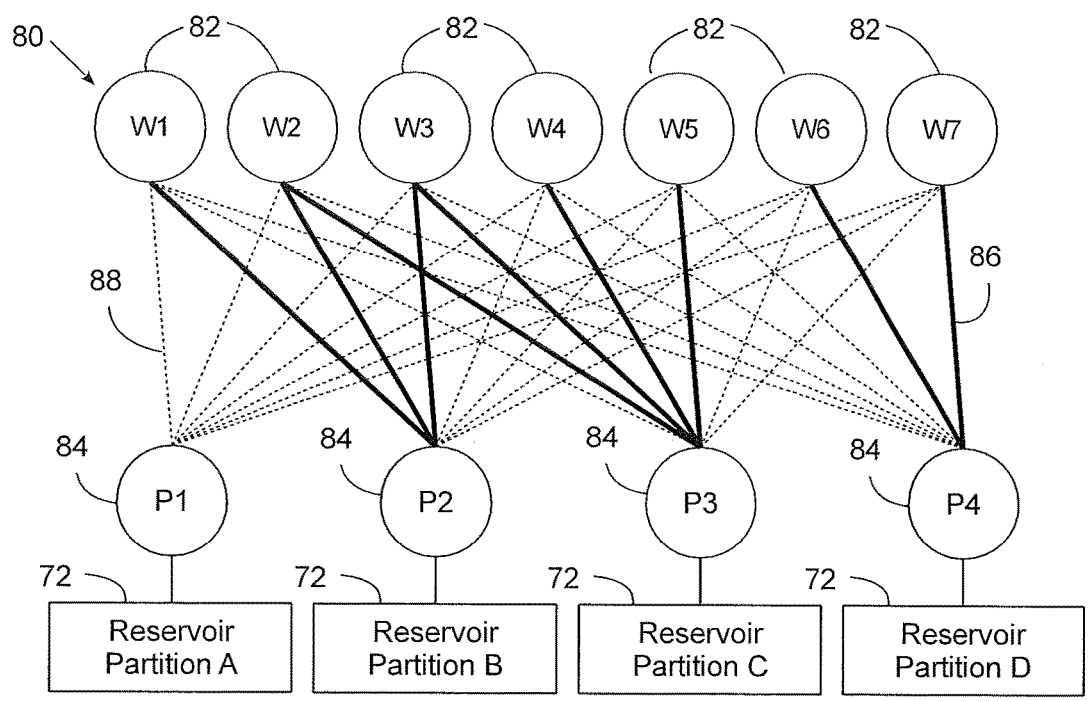
FIG. 7 is an example graph representing example well and processor nodes and connection and potential edges to be used in a reservoir simulation with the example reservoir model of FIG. 6.

FIG. 7 illustrates an example graph 80 that may be constructed for reservoir model 70 in the manner discussed above, with seven well nodes 82 corresponding to wells W1-W7 of FIG. 7, and four processor nodes 84 corresponding to solve processors P1-P4, each of which associated with a reservoir partition A-D of reservoir model 70. Connections or edges 86, 88 are shown between each solve processor node 84 and well node 82. Solid lines reflect connection edges 86 (e.g., as formed in block 56 of FIG. 5), while dashed lines reflect potential edges 88 (e.g., as added in block 58 of FIG. 5).

Using conventional well distribution techniques, wells W1-W7 would generally be assigned to the solve processors owning the top-most completions for those wells. Table I, for example, illustrates the well distribution for reservoir model 70 based upon this conventional technique:

TABLE I

Conventional Well Distribution

| Solve Processor | Well | Partition | Work |
|---|---|---|---|
| P1 |  | A | 0 |
| P2 | W1, W3 | B | 4 |
| P3 | W2, W4, W5 | C | 5 |
| P4 | W6, W7 | D | 3 |

As shown in the work column of Table I, the allocation of wells to solve processors is load imbalanced, assuming that each well completion has roughly the same computational cost.

In embodiments consistent with the invention, on the other hand, a graph partitioning operation may be used to better optimize the well distribution. For example, based upon routine 50 of FIG. 5, wells may be weighted based on costs, which in turn may be based on computation and/or communication costs. As shown in Tables II and III below, for example, the costs for each well may be based on the number of solve processors having connections to each well, as the connection of multiple solve processors to the same well will incorporate communication costs in addition to computation costs due to the need for each solve processor to make calls to the other solve processors connected to the well when performing a well solve operation:

TABLE II

Well Node Costs

| Well | Connected Processor | Costs |
|---|---|---|
| W1 | P2 | Comp Only |
| W2 | P2, P3 | Comp + Comm |
| W3 | P2, P3 | Comp + Comm |
| W4 | P3 | Comp Only |
| W5 | P3 | Comp Only |
| W6 | P4 | Comp Only |
| W7 | P4 | Comp Only |

TABLE III

Node Weight Vector + Edge Weighting Matrix

| Node Weight |  | A | B | C | D | W1 | W2 | W3 | W4 | W5 | W6 | W7 |
|---|---|---|---|---|---|---|---|---|---|---|---|---|
| 12 | A |  |  |  |  | 0.1 | 0.1 | 0.1 | 0.1 | 0.1 | 0.1 | 0.1 |
| 12 | B |  |  |  |  | 1 | 1 | 1 | 0.1 | 0.1 | 0.1 | 0.1 |
| 12 | C |  |  |  |  | 0.1 | 1 | 2 | 2 | 1 | 0.1 | 0.1 |
| 12 | D |  |  |  |  | 0.1 | 0.1 | 0.1 | 0.1 | 0.1 | 2 | 1 |
| 1 | W1 | 0.1 | 1 | 0 | 0.1 |  |  |  |  |  |  |  |
| 2 | W2 | 0.1 | 1 | 1 | 0.1 |  |  |  |  |  |  |  |
| 3 | W3 | 0.1 | 1 | 2 | 0.1 |  |  |  |  |  |  |  |
| 2 | W4 | 0.1 | 0.1 | 2 | 0.1 |  |  |  |  |  |  |  |
| 1 | W5 | 0.1 | 0.1 | 1 | 0.1 |  |  |  |  |  |  |  |
| 2 | W6 | 0.1 | 0.1 | 0 | 2 |  |  |  |  |  |  |  |
| 1 | W7 | 0.1 | 0.1 | 0 | 1 |  |  |  |  |  |  |  |

The resulting allocation of wells based upon the graph partitioning operation may result in an allocation such as shown in Table IV below:

TABLE IV

Graph Partitioning Operation Well Distribution

| Solve Processor | Well | Partition | Work |
|---|---|---|---|
| P1 | W3 | A | 3 |
| P2 | W1, W2 | B | 3 |
| P3 | W4, W5 | C | 3 |
| P4 | W6, W7 | D | 3 |

It will be appreciated that the allocation of wells to solve processors is load balanced relative to the conventional technique, resulting in improved performance when performing the well solve operations, and thus when performing an overall reservoir simulation.

While particular embodiments have been described, it is not intended that the invention be limited thereto, as it is intended that the invention be as broad in scope as the art will allow and that the specification be read likewise. It will therefore be appreciated by those skilled in the art that yet other modifications could be made without deviating from its spirit and scope as claimed.

What is claimed is:

1. A method of partitioning wells in a parallel reservoir simulation environment, comprising:
   in a computer, generating a graph including a plurality of well nodes connected to a plurality of processor nodes by a plurality of edges, wherein each well node is representative of a well, and wherein each processor node is representative of a computer processing resource among a plurality of computer processing resources in the parallel reservoir simulation environment;
   forming a connection edge between a first well node and a first processor node if the first processor node owns any reservoir cells connected to the well represented by the first well node;
   weighing the connection edge based on a number of owned cells in a reservoir model connected to the well represented by the first well node, wherein weighting in the graph is further based on at least one selected from a group consisting of a communication cost and a cost to perform a well solve operation;
   forming potential edges between each pair of well nodes and processor nodes not having a connection edge, the potential edges weighted lower than any connection edge;
   partitioning the wells among the plurality of computer processing resources by performing a graph partition operation on the graph to obtain a partitioned graph, wherein the partitioning is performed, at least in part, to balance the communication cost versus the cost to perform the well solve operation; and
   executing a reservoir simulation, in parallel, on the plurality of computer processing resources according to the partitioned graph.

2. The method of claim 1, further comprising weighting at least one of the well nodes, the processor nodes or the edges.

3. The method of claim 1, further comprising weighting each well node based upon a cost of solving the represented well.

4. The method of claim 3, further comprising dynamically determining the cost of solving the represented well.

5. The method of claim 3, further comprising determining the cost of solving the represented well by accessing a cost model.

6. The method of claim 3, further comprising weighting each processor node based upon a sum of a weight of each well node.

7. The method of claim 1, further comprising performing a plurality of parallel well solves after partitioning the wells.

8. The method of claim 7, further comprising running a reservoir flow simulation after performing the plurality of parallel well solves.

9. The method of claim 7, further comprising dynamically repartitioning the wells while performing the plurality of parallel well solves.

10. An apparatus, comprising:
    at least one processor; and
    program code configured upon execution by the at least one processor in a parallel reservoir simulation environment to:
       generate a graph including a plurality of well nodes connected to a plurality of processor nodes by a plurality of edges, wherein each well node is representative of a well, and wherein each processor node is representative of a computer processing resource among a plurality of computer processing resources in the parallel reservoir simulation environment;
       form a connection edge between a first well node and a first processor node if the first processor node owns any reservoir cells connected to the well represented by the first well node;
       weigh the connection edge based on a number of owned cells in a reservoir model connected to the well represented by the first well node, wherein weighting in the graph is further based on at least one selected from a group consisting of a communication cost and a cost to perform a well solve operation;
       form potential edges between each pair of well nodes and processor nodes not having a connection edge, the potential edges weighted lower than any connection edge;
       partition the wells among the plurality of processing resources by performing a graph partition on the graph to obtain a partitioned graph, wherein the partitioning is performed, at least in part, to balance the communication cost versus the cost to perform the well solve operation; and
       execute a reservoir simulation, in parallel, on the plurality of computer processing resources according to the partitioned graph.

11. The apparatus of claim 10, wherein the program code is further configured to weight each well node based upon a cost of solving the represented well, wherein the cost is determined dynamically or by accessing a cost model.

12. The apparatus of claim 11, wherein the program code is further configured to weight each processor node based upon a sum of a weight of each well node.

13. The apparatus of claim 10, wherein the program code is further configured to perform a plurality of parallel well solves after partitioning the wells.

14. A program product, comprising:
    a non-transitory computer readable medium; and
    program code stored on the computer readable medium and configured upon execution by at least one processor in a parallel reservoir simulation environment to:
       generate a graph including a plurality of well nodes connected to a plurality of processor nodes by a plurality of edges, wherein each well node is representative of a well, and wherein each processor node is representative of a computer processing resource among a plurality of processing resources in the parallel reservoir simulation environment;

form a connection edge between a first well node and a first processor node if the first processor node owns any reservoir cells connected to the well represented by the first well node;

weigh the connection edge based on a number of owned cells in a reservoir model connected to the well represented by the first well node, wherein weighting in the graph is further based on at least one selected from a group consisting of a communication cost and a cost to perform a well solve operation;

form potential edges between each pair of well nodes and processor nodes not having a connection edge, the potential edges weighted lower than any connection edge;

partition the wells among the plurality of processing resources by performing a graph partition on the graph to obtain a partitioned graph, wherein the partitioning is performed, at least in part, to balance the communication cost versus the cost to perform the well solve operation; and execute a reservoir simulation, in parallel, on the plurality of computer processing resources according to the partitioned graph.

* * * * *